United States Patent [19]

Ettinger et al.

[11] Patent Number: 5,895,548
[45] Date of Patent: Apr. 20, 1999

[54] HIGH POWER MICROWAVE PLASMA APPLICATOR

[75] Inventors: Gary C. Ettinger; Quanyuan Shang, both of San Jose; Kam S. Law, Union City, all of Calif.

[73] Assignee: Applied Komatsu Technology, Inc., Tokyo, Japan

[21] Appl. No.: 08/626,258

[22] Filed: Mar. 29, 1996

[51] Int. Cl.$^6$ .................. C23F 1/02; H01J 7/24; H05H 1/24
[52] U.S. Cl. .................. 156/345; 118/723 ME
[58] Field of Search .................. 118/723 ME; 156/345; 315/39, 112, 111.21; 313/22.36

[56] References Cited

U.S. PATENT DOCUMENTS

| | | | |
|---|---|---|---|
| 2,964,679 | 12/1960 | Schneider et al. | 315/111.41 |
| 3,221,212 | 11/1965 | Gorowitz et al. | 315/111.21 |
| 3,753,144 | 8/1973 | Kearns et al. | 372/35 |
| 4,492,620 | 1/1985 | Matsuo et al. | 204/192.12 |
| 4,654,504 | 3/1987 | Sullivan et al. | 219/121.48 |
| 4,918,031 | 4/1990 | Flamm et al. | 437/225 |
| 4,941,915 | 7/1990 | Matsuoka et al. | 204/298.12 |
| 5,008,593 | 4/1991 | Schlie et al. | 315/39 |
| 5,055,741 | 10/1991 | Schlie | 315/39 |
| 5,082,517 | 1/1992 | Moslehi | 156/345 |
| 5,124,998 | 6/1992 | Arrigoni et al. | 372/61 |
| 5,235,251 | 8/1993 | Schlie | 315/112 |
| 5,361,016 | 11/1994 | Ohkawa et al. | 315/111.41 |
| 5,625,259 | 4/1997 | Holber et al. | 315/111.21 |

FOREIGN PATENT DOCUMENTS

| | | | |
|---|---|---|---|
| 217399 | 4/1987 | European Pat. Off. | 315/111.21 |
| 0 480 581 A1 | 4/1992 | European Pat. Off. | |
| 0 680 071 | 11/1995 | European Pat. Off. | |
| 0 726 593 | 8/1996 | European Pat. Off. | |
| A-63-199471 | 8/1988 | Japan. | |
| A-64 000725 | 1/1989 | Japan. | |
| 1-77900 | 3/1989 | Japan | 315/111.21 |
| A-526-249 | 7/1972 | Switzerland. | |
| A-1-240 031 | 7/1971 | United Kingdom. | |
| WO 94/29494 | 12/1994 | WIPO. | |

OTHER PUBLICATIONS

European Search Report dated May 28, 1996.

Schlie, "Hydraulic fluid as a liquid coolant of high power, cw microwave (2.45 GHz) plasma tubes," *Rev. Sci. Instrum.* 62:542–543 (Feb. 1991).

Pande et. al., "Plasma Enhanced Metal–Organic Chemical Vapor Deposition of Aluminum Oxide Dielectric Film For Device Applications," *J. Appl. Phys.* 54:5436–5440 (1983).

Pande, et al., "A Novel Low–Temperature Method of SiO$_2$ Film Deposition for Mosfet Applications," *Journal of Electronic Materials*, 13:593–602 (1984).

*Primary Examiner*—Jeffrey E. Russel
*Attorney, Agent, or Firm*—Fish & Richardson

[57] ABSTRACT

A plasma applicator including a cylindrically-shaped outer tube; a cylindrically-shaped plasma tube located within and concentric with the outer tube, and having a first end and a second end; a first support located at the first end of the plasma tube; a seal surrounding the plasma tube at its first end, compressed between the plasma tube and the first support, and located at a first distance from the first end of the plasma tube; and a shield extending a second distance into the plasma tube.

31 Claims, 4 Drawing Sheets

HIGH POWER MICROWAVE PLASMA APPLICATOR

BACKGROUND OF THE INVENTION

The invention relates generally to plasma applicators.

Plasma-based, excitation sources or plasma applicators must often be able to handle high input powers and withstand high temperatures combined with a highly reactive chemical environment. For example, in a common application of a plasma applicator, $NF_3$ gas flows into the applicator and is broken down by the plasma. The resulting activated species flows out of the applicator and into the semiconductor processing equipment where it is used for in-situ chamber cleaning, etching, photo resist stripping, or any of a number of other tasks. As an example of using the reactive species for in-situ chamber cleaning refer to U.S. Ser. No. 08/278,605, entitled "A Deposition Chamber Cleaning Technique Using a Remote Excitation Source" filed on Jul. 21, 1994, now abandoned and incorporated herein by reference.

The extremely hostile environment to which such equipment is exposed can disable the plasma applicator very quickly. For example, some applicators that are commercially available use quartz tubes to contain the activated species. In those systems, the fluorine that is produced etches the tube quite quickly. Moreover, at high power levels (e.g. above 1 kW) the quartz will tend to break down. Thus, after using the applicator only a few times or for a sustained period of operation, the wall of the tube will become so thin that it will collapse under continued exposure to the high temperatures and the vacuums that are used in such systems. Thus, very early in the life of the tube, it must be discarded and replaced with a new tube. Both the inconvenience and cost of having to repeatedly replace the quartz tube can be quite high.

Some existing plasma applicators use ceramic tubes in place of the quartz tubes. Ceramic tubes are capable of holding up better than the quartz tubes in the chemically corrosive environments often encountered. But ceramic tubes are not a panacea. They typically have a relatively high thermal expansion coefficient as compared to quartz and other materials. Thus, repeated cycling between room temperature and the high processing temperatures that commonly occur in these systems produces large stresses within the ceramic tubes. These stresses eventually result in the tubes cracking and failing.

Some microwave plasma applicators have been developed which use two concentric tubes, namely, an outer tube and an inner tube both of which are made of materials that are transparent to the microwave radiation, e.g. quartz and sapphire. The inner tube contains the plasma and thus is the tube that is exposed to the high temperature and corrosive conditions. To cool the inner tube, water is flowed through the annular region between the two tubes. Such a system is described in U.S. patent application Ser. No. 08/387,603, filed Feb. 13, 1995, now abandoned, and incorporated herein by reference. Since water absorbs microwaves, there is a severe restriction on how thick the annular region can be made. If it is too thick, the microwaves will be seriously attenuated and it will be difficult or even impossible to initiate and sustain a plasma within the inner tube. On the other hand, if this region is too thin, cooling efficiency will be seriously compromised.

In spite of these advances in plasma applicator design, the high thermal stresses produced by thermal expansion of the plasma tube still results in cracked tubes. In addition, the plasma tubes are not the only components that fail. Seals and O-rings which aid in maintaining a vacuum within the plasma tube and which aid in sealing the coolant system also rapidly deteriorate and eventually fail when exposed to the high temperatures and other hostile conditions produced in such systems. Moreover, as the power levels are increased beyond the 1 kW levels, the failure problems in currently available plasma applicators become even more severe and the frequency of failures rises.

SUMMARY OF THE INVENTION

In general, in one aspect, the invention is a plasma applicator including a cylindrically-shaped outer tube; a cylindrically-shaped plasma tube located within and concentric with the outer tube, and having a first end and a second end; a first support located at the first end of the plasma tube; a seal surrounding the plasma tube at its first end, compressed between the plasma tube and the first support, and located at a first distance from the first end of the plasma tube; and a shield extending a second distance into the plasma tube.

In general, in another aspect, the invention is a plasma applicator including a cylindrically-shaped outer tube; a cylindrically-shaped plasma tube located within and concentric with the outer tube, and having an inside wall; an adapter having a plug extending into the plasma tube and defining an annular gap region between the portion of the plug extending into the plasma tube and the inside wall of the plasma tube, wherein the adapter includes a passage formed therein and in communication with the annular gap region so as to form a route through which a process gas is flowed into the plasma tube during operation.

In general, in still another aspect, the invention is a plasma applicator including a cylindrically-shaped outer tube; a cylindrically-shaped plasma tube located within and axially aligned with the outer tube, and having a first end and a second end; a first support located at the first end of the plasma tube, having a first hole formed therein and receiving both the plasma tube and the outer tube; a first seal surrounding the plasma tube at its first end and extending between the plasma tube and the inside wall of the first hole; and a second seal surrounding the outer tube and extending between the outer tube and the inside wall of the first hole. The cylindrically shaped plasma tube and outer tube form an annular gap region therebetween and through which a coolant flows during operation.

In preferred embodiments, the plasma applicator of also includes a second support located at the second end of the plasma tube, having a second hole formed therein, and receiving both the plasma tube and the outer tube; a third seal surrounding the plasma tube at its second end and extending between the plasma tube and the inside wall of the second hole; and a fourth seal surrounding the outer tube and extending between the outer tube and the inside wall of the second hole. The plasma tube is longer than the outer tube and the plasma tube extends outside both ends of the outer tube. The first support includes a plurality of coolant inlet ports passing therethrough and extending into the hole formed therein. The plurality of coolant inlet ports are positioned around the axis of the plasma tube so as to produce a net force on the plasma tube in the radial direction of substantially zero when coolant is injected through the plurality of coolant inlet ports into the annular gap region.

In general, in yet still another aspect, the invention is a plasma applicator including a cylindrically-shaped outer tube; a cylindrically-shaped plasma tube located within and axially aligned with the outer tube, having a first end and a second end, and with the outer tube forming an annular gap region therebetween through which a coolant flows during operation; a first support located at the first end of the plasma tube, having a generally cylindrically-shaped hole formed therein, and receiving the plasma tube and the outer tube; a first seal surrounding the plasma tube at its first end and extending between the plasma tube and the inside wall of the cylindrically shaped hole, the first seal located at a first distance from the first end of the plasma tube; and a second seal surrounding the outer tube and extending between the outer tube and the inside wall of the cylindrically shaped hole; wherein the first support includes a plurality of coolant inlet ports passing therethrough and extending into the hole formed therein, the plurality of coolant inlet ports being positioned symmetrically around the axis of the plasma tube.

A plasma applicator which embodies different aspects of the invention can easily handle 6 kW and it is believed that it can even handle significantly higher power levels without problems.

The unique configuration of the O-rings provides: concentricity of the sapphire and quartz tube, allows for differential thermal expansion of applicator components thus reducing stress on critical components like the sapphire tube, and seals the gas/plasma and water systems. Also, since it uses separate O-rings to seal water and the gas/plasma systems, the seals can be optimized for each purpose.

In addition, the unique shield design (i.e., the extensions which extend into the plasma tube at either end) provides protection for the sapphire tube O-rings in several ways. It protects them from direct exposure to the broadband plasma emissions which pass through the transparent, sapphire plasma tube. It also provides a long path (i.e., a labyrinth seal) through which the plasma must travel before it gets to the plasma O-ring. This path discourages the plasma from reaching the O-rings and causes the plasma to cool and perhaps become less active by the time it reaches the seals. In addition, the shields also reduce the heat input to the ends of the sapphire tube from the plasma, keeping the temperature of the ends of the sapphire tube lower. This extends the life of the O-rings as they are in direct contact with the sapphire tube and are degraded by high temperatures. Shielding the plasma O-ring is vital as this does not receive the benefit of direct water cooling as do the other O-rings in contact with the tubes.

Also, the hard coat anodization of the shields (e.g. the extension at the end of the plasma tube) which come into direct contact with the plasma greatly reduces the risk of arcing which can cause particles that contaminate the system and the process chamber.

Other advantages and features will become apparent from the following description of the preferred embodiment and from the claims.

DESCRIPTION OF THE PREFERRED EMBODIMENTS

Figure 1:
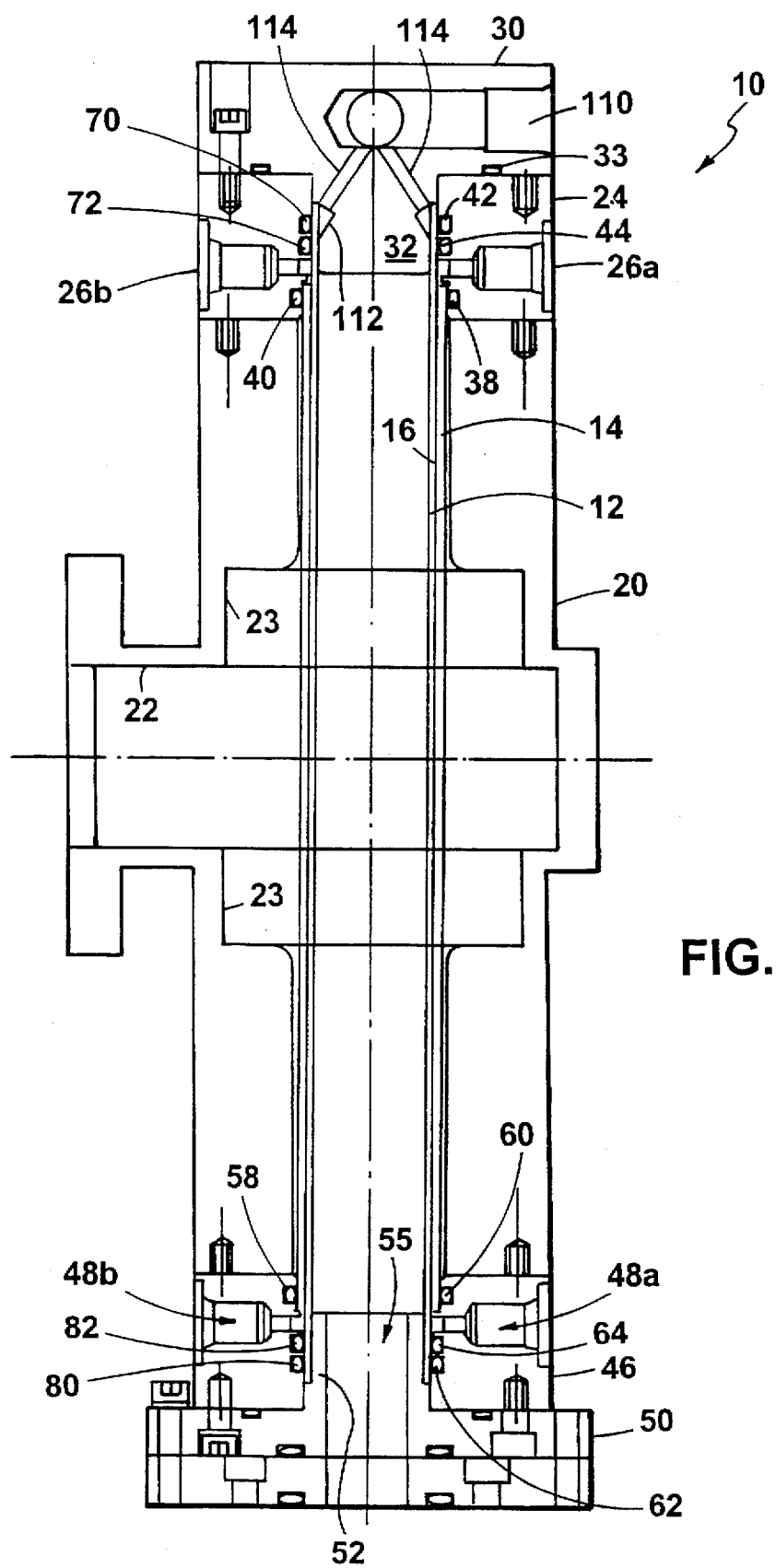
FIG. 1 shows a cross-section of a microwave plasma applicator in accordance with the invention.
Figure 2:
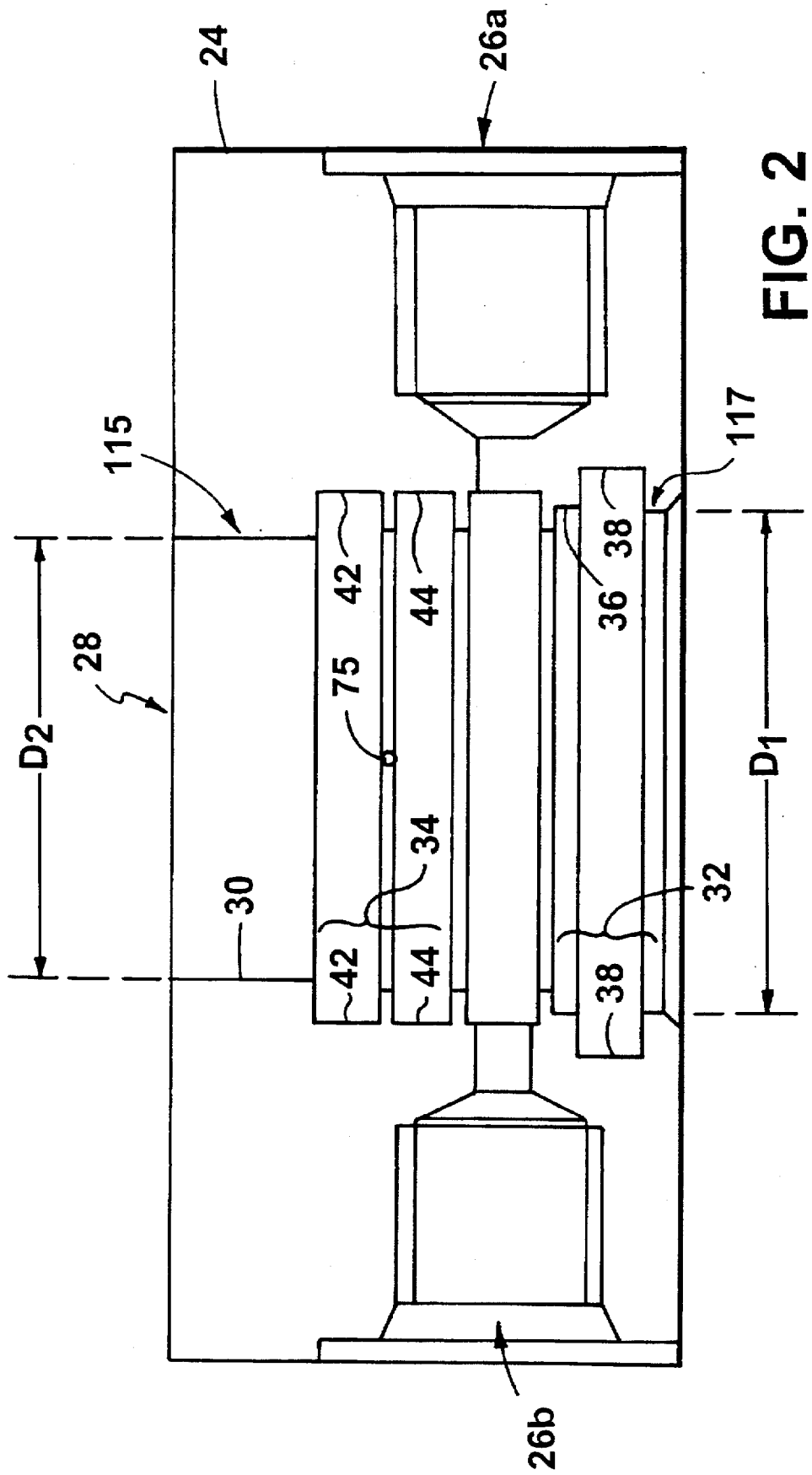
FIG. 2 shows a cross-section of the upper collar from FIG. 1.
Figure 3:
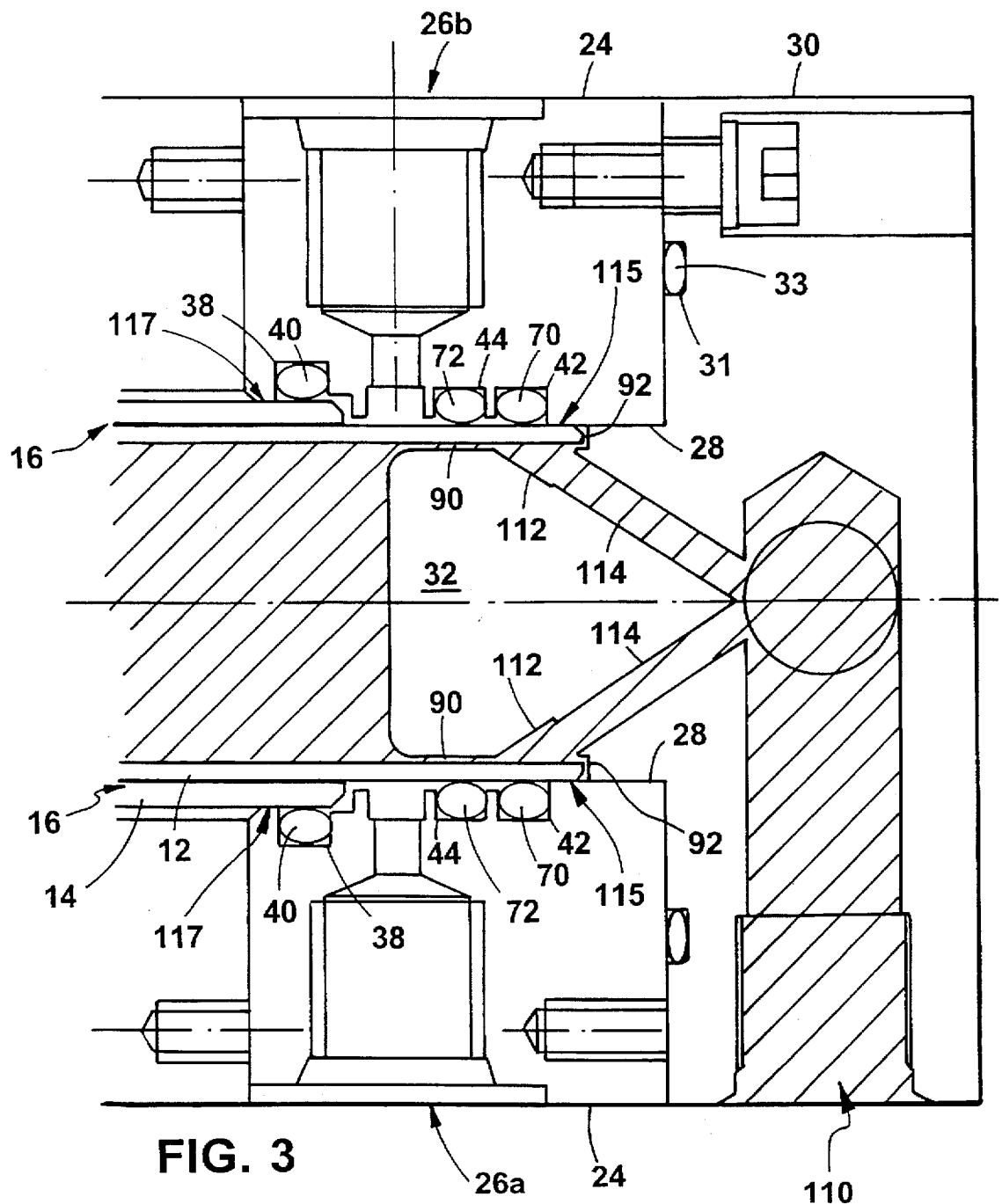
FIG. 3 shows the input end of the plasma applicator of FIG. 1.

Referring to FIGS. 1–3, a liquid-cooled, high powered remote plasma applicator 10 which embodies the invention includes a sapphire plasma tube 12 that is aligned within and is concentric with an outer quartz tube 14. Plasma tube 12, which is longer than quartz tube 14, is positioned within quartz tube 14 so that it extends out of either end of quartz tube 14. The inner wall of quartz tube 14 and the outer wall of plasma tube 12 define a thin annular region 16 (more clearly in FIG. 3) through which coolant is flowed to cool plasma tube 12. If water or some other microwave absorbing liquid is used as the coolant, the radial dimension of the gap is made sufficiently small so that the coolant will not absorb too much of the microwave energy.

Tubes 12 and 14 are supported within a metal (e.g. aluminum) housing which is made up of several components including a central body 20. Central body 20 contains a rectangular waveguide section 22 with a cylindrically-shaped resonant cavity 23 formed around the tubes 12 and 14 and extending both above and below the rectangular waveguide section. Rectangular waveguide section 22 receives microwave energy from a source 208 (see FIG. 4) and couples it into plasma tube 12 where during operation it generates and maintains a plasma. The housing also includes an upper support collar 24 and a lower support collar 46, both of which are screwed onto corresponding opposite ends of central body 20. Upper and lower support collars 24 and 46 fit over and physically support the ends of tubes 12 and 14. At the gas inlet end of the applicator, a cap plate 30 with a plug extension 32 bolts into upper support collar 24 so that plug extension 32 extends down into plasma tube 12. At the outlet end of applicator 10, an adapter plate 50 which has a hollow cylindrical extension 52 bolts onto lower support collar 46 so that its cylindrical extension extends up into plasma tube 12.

Upper support collar 24 (shown in greater detail in FIG. 2) includes two coolant inlet ports 26a and 26b which are located symmetrically opposite each other and which communicate with a cylindrical hole 28 passing through the center of collar 24. Hole 28 has a stepped inner wall 30 defining a lower cylindrical region 32 having a diameter $D_1$ and an upper cylindrical region 34 having a different, smaller diameter $D_2$. $D_1$ is slightly larger than the outside diameter of quartz tube 14 so that it accommodates the quartz tube. In addition, an inner wall 36 of the lower cylindrical region 32 has a single groove 38 which holds an O-ring 40. The diameter of the upper cylindrical region 34, $D_2$ is slightly larger than the outside diameter of plasma tube 12 but smaller than the outside diameter of quartz tube 14. Thus, upper cylindrical region 34 accommodates plasma tube 12. In addition, an inner wall 30 of the upper cylindrical region 34 has two grooves 42 and 44 formed therein, each of which holds a corresponding one of two O-rings 70 and 72. Grooves 42 and 44 are located adjacent to and above the location at which the inlet ports 26a and 26b which pass through the collar and groove 38 is located adjacent to and below inlet ports 26a and 26b.

When upper collar 24 is assembled onto the main body with both tubes 12 and 14 in place, the lower O-ring 40 compresses around and securely holds quartz tube 14 while the two upper O-rings 70 and 72 compress around and securely hold plasma tube 12.

Lower support collar 46 is designed very similarly to upper collar 24. It includes two coolant outlet ports 48a and 48b which are also located symmetrically opposite each other and which communicate with a cylindrical hole passing through the center of lower support collar 46. the hole in lower support collar 46 has a stepped inner wall defining a upper cylindrical region having diameter $D_1$ and an lower cylindrical region having a diameter $D_2$. The inner wall of the upper cylindrical region includes two grooves, namely, a lower groove 62 and an upper groove 64, each of which holds a corresponding one of two O-rings 80 and 82. And the inner wall of the upper cylindrical region includes a single groove 58 which holds an O-ring 60. Grooves 62 and 64 are located adjacent to and below the location at which the outlet ports 48a and 48b pass through support collar 46; whereas groove 58 is located adjacent to and above outlet ports 48a and 48b.

In upper support collar 24, O-rings 40 and 72 and in lower support collar 46, O-rings 60 and 82 function as seals which prevent the coolant from leaking out of the coolant jacket that is formed around plasma tube 12. O-rings 70 and 80 function as seals which prevent the plasma and the activated gases within the plasma tube from leaking out. In the event that water and/or gases do happen to leak past the seals, there is a bleed hole 75 which allows the leakage to escape without risk of breaching the second seal. Bleed hole 75 is drilled through the upper and lower support collars 24 and 46 between the two grooves that hold the water and plasma O-rings (see FIG. 2). A similarly situated bleed hole is also present in lower support collar 46 to handle possible leakage past the two O-rings at the other end of the applicator.

Two types of O-rings are used. The O-rings which come into contact with the coolant (i.e., O-rings 40, 60, 72, and 82) are commercially available ethylene propylene O-rings. Whereas, the O-rings that could potentially come into contact with the plasma (i.e., O-rings 70 and 80) are made of a microwave non-absorbing and chemically resistant material. The described embodiment uses white Kalrez™ O-rings that are commercially available from Dupont Corp.

The configuration of O-rings 40, 60, 70, 72, 80 and 82 offers at least two additional important advantages beyond providing seals against leakage. First, they help maintain the concentricity of the two tubes. Second, they permit the differential axial thermal expansion of the two tubes without creating any excessive stresses that might crack or damage the tubes.

When cap plate 30 is assembled onto upper support collar 24, the cylindrically-shaped plug extension 32 extends sufficiently far into plasma tube 12 so that its lower end is at least below the level of the coolant O-ring 72. Cap plate 30 includes a circular O-ring groove 31 formed in the portion of its surface which mates against the upper support collar. Groove 31 holds a Viton™ O-ring 33 which helps maintain a vacuum within plasma tube 12 and which also prevents reactive gases from leaking out.

Plug extension 32 of cap plate 30 functions as a shield for the two O-rings which come into contact with the plasma tube (i.e. O-rings 70 and 72), protecting the O-rings from being directly irradiated by the hostile radiation that is generated by the plasma. In the described embodiment, cap plate 30 is made entirely of aluminum which is, of course, a very good thermal conductor. Plug extension 32 also serves to protect the O-rings from the high temperatures that are produced in the plasma by reducing heat input into the nearby portions of the plasma tube.

Cap plate 30 also provides passages through which process gas is introduced into plasma tube 12. The cylindrically-shaped plug extension 32 has a diameter which is less than the inside diameter of plasma tube 12 so that when cap 30 is assembled onto applicator 10, a thin annular gap region 90 exists between plug portion 32 and the inside wall of plasma tube 12. Near its upper end, plug extension 32 has a shoulder 92 that is formed by a step increase in the diameter of the plug. Shoulder 92 acts as a stop that prevents the plasma tube from sliding in an axial direction on plug 32 once the apparatus is assembled. When the applicator is assembled shoulder 92 and a corresponding shoulder at the other end are spaced apart a distance that is sufficiently greater than the length of the plasma tube so as to allow the plasma tube tube to be able to freely expand in an axial direction when heated.

A bore hole 110 extends horizontally in a radial direction into cap plate 30 and passes beyond the center of the cap plate. This bore hole 110 forms an inlet port through which the precursor gas is fed into the applicator 10. Around the circumference of plug 32 near shoulder 92 (i.e., just before the point at which the diameter of plug 32 increases), there is a V-shaped groove 112 which forms an annular cavity around the plug extension. Groove 112 is in communication with bore hole 110 through two or more passages 114 that are drilled into the cap plate at an angle of approximately 45° relative to the axis of the cap plate. These passages 114, which are located at 180° from each other relative to the axis of the cap plate, extend from one wall of groove 112 to bore hole 110 near the center of the cap plate.

During operation, precursor gas that is introduced into bore hole 110 flows through these connecting passages 114 and into V-shaped groove 112 which circumvents the plug and acts like a plenum chamber. Gas from the V-shaped groove 112 then flows through the thin annular gap region 90 and into the interior of plasma tube 12 where it is excited by the microwave energy to produce a plasma. By flowing the gas into an annular cavity that surrounds the cap plug, the gas is evenly distributed around the inside surface of the plasma tube. In addition, since the gas is injected along the wall of the plasma tube in the thin annular gap region, this protects the O-ring from plasma. It does this in two ways. First, since annular gap region 90 is thin, it discourages the plasma from penetrating along the plasma tube wall within the gap region. Also, the outward flow of gas creates a buffer from the plasma which tends to further discourage the plasma from penetrating into the gap.

Cylindrical extension 52 of adapter plate 50 serves a similar function to that served by plug extension 32 on cap plate 30. That is, when adapter plate 50 is assembled onto applicator 10, cylindrical extension 52 extends up into plasma tube 12 beyond the level of O-ring 82, i.e., the coolant seal. Thus, the metal extension acts as a shield protecting the two O-rings 80 and 82 from exposure to the heat and radiation produced by the plasma.

Cylindrical extension 52 includes a bore 55 through which activated species passes out of the applicator for transfer to the main processing chamber. It has been found that making the bore smaller has two advantages. First, a smaller diameter bore tends to prevent arcing caused by the plasma and to discourage the microwaves from penetrating out through the bore. In addition, a smaller bore relative to the outside diameter of the cylindrical extension enables one to use a larger radius curve at the end of the extension, where the inside wall of the extension meets the outside wall of the extension. This has advantages which are associated with the protective layer that is formed in the extensions and which is described next.

In the described embodiment, plug extension 32 at the inlet end of the applicator has a hard coat anodization layer formed on it to protect them from the highly corrosive atmosphere that is produced within the plasma tube. The hardcoat anodization layer, which is about 0.001 inch thick, prevents the pitting of the exposed metal surfaces. Without this protective layer, noticeable damage to the metal occurs and this produces particles which contaminate the chamber and ruin product. The hard coat anodization process is performed in accordance with well known military spec identified as MIL A 8525, TYPE III, CLASS 1, NON DYED.

To produce an effective hard coat anodization layer, it is desirable that extension 32 has only smooth, gently rounded corners. If there are any sharp edges or small radius corners, the hard coat anodization will not adhere to those regions and the protection will not be adequate.

It is optional to also apply a hard coat anodization to the extension 52 at the downstream end of the applicator. In that case, it is desirable to have a relatively thick wall on cylindrical extension 52 or shield. This implies a smaller bore relative to the outside diameter of the extension. A thicker wall also has better heat transfer and thus smaller thermal gradients, as compared to a thinner wall.

The outside diameter of the cylindrical extension is sufficiently smaller than inside diameter of the plasma tube so as to produce easy assembly. This, of course, produces a thin annular gap region between the outer wall of the cylindrical extension and the inner wall of the plasma tube, similar to the annular gap region 90 formed around the plug extension at the other end of the applicator. In the described embodiment, no gas is flowed through this gap. However, it should be noted that the same gas injection method as was described for the inlet side of the applicator can also be used at the outlet side of the applicator. In other words, a gas can be flowed into the lower end of the plasma tube through the annular gap region that is formed by the lower shield extension. The injected gas will tend to discourage the plasma from penetrating the gap. In this case, however, the gas that is flowed through the gap need not be the same as the cleaning gas that is being injected into the other end of the plasma tube. It could be, for example, an inert gas or a typical carrier gas, such as nitrogen, helium, or argon, just to name three examples.

The configuration of the water ports is another important feature of the described embodiment. The water feed at the top is balanced so that it produces no net pressure on the tube in a radial direction. The flow of coolant into the system through each of inlet ports 26a and 26b tends to produce a radial force on the plasma tube. By using two inlet ports and positioning them opposite each other in upper support collar 24, the side force produced by one of the coolant flowing through one of the inlets will be balanced by the equal and oppositely directed side force generated by the other inlet. Thus, the net radial force that is generated on the plasma tube as a result of pumping coolant through the system will be zero. This means that there will be no net radially directed force that tends to cause the plasma tube to drift to one side over time. If the force is not balanced, the O-rings, which are made of a resilient material, would tend to deform, thereby allowing the plasma tube to drift sideways so that it is no longer concentric with the quartz outer tube. The result would be that the annular gap would no longer have a uniform thickness around the plasma tube, and the cooling would become nonuniform around the tube and thus less effective.

Though the described embodiment shows only two inlet ports which are located opposite each other, any other configuration of inlet ports can be used so long as the net radially directed force on the plasma tube is substantially zero. Thus, for example one could use n inlet ports, evenly spaced around the support collar and separated from each other by 360°/n. Notice, that the number of inlet ports need not be even but there does need to be more than one.

If water is used as the coolant, the narrow radial gap between the sapphire tube and the quartz tube typically can be in the range of between 0.005 to 0.020 inches. The gap needs to be sufficiently large to provide for effective cooling of the sapphire tube, while also minimizing the mass of water that absorbs the microwave energy. If the gap is made too narrow, the pressure drop created by the cooling jacket will be too great and assembly will be more difficult. On the other hand if the gap is too large, the attenuation of the microwave energy will be too great and that will detrimentally affect the performance and efficiency of the plasma applicator.

In the described embodiment, sapphire tube 12 has an O.D. of 1.168 inch and an I.D. of about 1.040. Quartz tube 14 has an O.D. of about 1.328 inch and an I.D. of 1.184 inch, which thus defines a radial gap of about 0.008 for coolant flow. In addition, sapphire tube 12 is about 11 inches long and quartz tube 14 is about 9.5 inches long, so that sapphire tube 12 extends out of each end of quartz tube 14 by about 0.75 inches.

Both plug extension 32 and cylindrically-shaped extension 52 have an outside diameter of about 1.000. Thus, the annular gap regions at both ends of the applicator have a radial dimension of about 0.020 inches. Furthermore, in the described embodiment, bore 55 through cylindrical extension 52 has a diameter of about 0.75 inches.

The holes through the upper and lower support collars at locations identified by 115 and 117 are nominally about 0.004–0.005 inches larger in the radial dimension than are the tubes which are supported within the holes at those points. Thus, the tubes do not normally contact the support collars when held in place by the O-rings. However, if for any reason either of the tubes should drift sideways in a radial direction, their drift will be limited by this dimension so that the tubes cannot touch each other.

The extensions or shields at either end of the applicator can penetrate deeper into the plasma tube than described above. This would, of course, provide even greater protection of the O-rings. They could also be shorter than shown if less protection of the O-rings is acceptable. In addition, note that the plasma that is generated within the plasma tube tends to fill the entire tube. Thus, in the described embodiment, we have made the applicator slightly asymmetrical, with a larger portion of the plasma tube being above the microwave cavity than below it. That is, the distance from the input end of the tube to the center of the microwave cavity is less than the distance from the center of the microwave cavity to the output end of the applicator. That is not to suggest, however, that there might not be other profiles that are also desirable. In addition, though we have described specific materials for the plasma tube, the outer tube, the O-rings, and the applicator housing and components thereof, it should be understood that other materials could also be used. For example, the outer tube need not be of quartz so long as the material selected is transparent to the microwave energy and it can withstand the temperatures that it will be exposed to. In addition, other materials can be used for the plasma tube besides sapphire, e.g. quartz, or other ceramics.

AN EXEMPLARY PROCESSING SYSTEM

Figure 4:
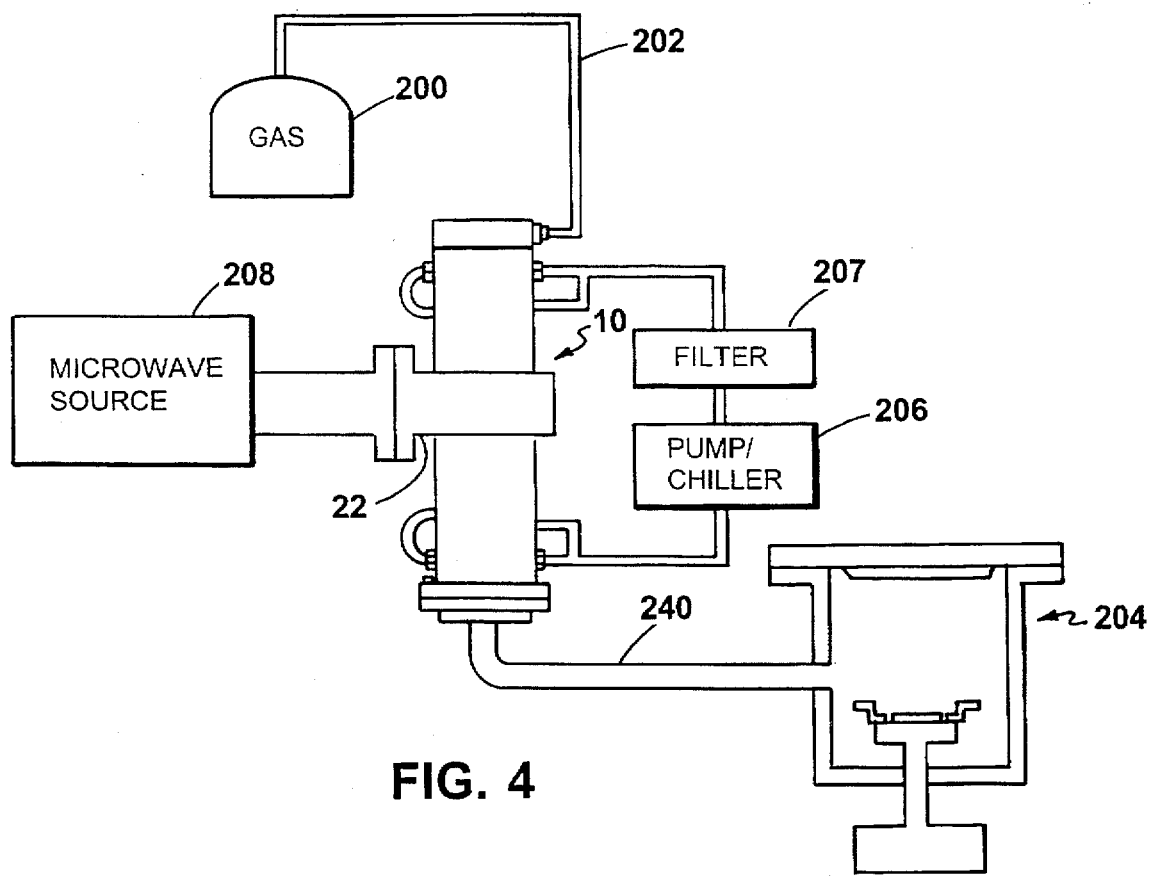
FIG. 4 is a block diagram of a plasma processing system that uses the plasma applicator shown in FIG. 1.

The plasma applicator described above may be used in a wide variety of applications. For example, it can be used as a remote source of activated gas species in a plasma processing system, such as is illustrated in FIG. 4. In that application, an external gas source 200 supplies a gas (e.g.

NF$_3$, C$_2$F$_6$, CF$_4$, just to name a few.) to the gas inlet port of plasma applicator 10 through a conduit 202. Microwave energy from a microwave source 208 enters the applicator through waveguide 22 and activates the gas that is flowing through the sapphire plasma tube within the applicator. Activated gas species that is produced in plasma applicator 10 is, in turn, supplied to a plasma chamber 204 through another line 240 connected to the gas outlet port of plasma applicator 10. A pump/chiller unit 206 is connected between the coolant inlet and outlet ports of the applicator's cooling system and circulates a coolant through applicator 10 when it is being operated. A filter 207 in the coolant circuit filters debris out of the coolant stream. In the described embodiment, the filter is a 0.2 micron filter.

Other components are typically present in such a system including, for example, a vacuum pump for evacuating the plasma chamber, a power source (e.g. an RF supply or a DC supply) for generating a second plasma in the plasma chamber. These components are not shown because persons skilled in the art would be familiar with the components that are used in a working plasma system.

Note that the excited species can be transported to the processing chamber in any appropriate way. In addition, the applicator can be mounted directly to the substrate processing chamber or be located remote from it, in which case an activated gas supply line made of an appropriate material will be required. If the activated species is highly reactive, as would be the case for activated fluorine, line 240 must be made of a material that does not interact with the activated species that is being produced, e.g. sapphire. Other appropriate materials include stainless steel, aluminum, ceramic, or some fluorine based material. In addition, if a metal line is used, it may be necessary to include a section of it that is made of a nonconductive or dielectric material, such as sapphire, to provide electrical isolation of the applicator from the plasma process chamber.

Other embodiments are within the following claims. For example, we could use a single O-ring where we have shown two O-rings (see O-rings 70 and 72 and O-rings 80 and 82 in FIG. 1). The gas distribution manifold and the labyrinth seal (i.e., the long pathway through the annular gap region and around the end of the plasma tube) acts to keep the plasma and activated gases away from the O-rings.

What is claimed is:

1. A plasma applicator comprising:
a cylindrically-shaped outer tube;
a cylindrically-shaped plasma tube located within and concentric with the outer tube, said plasma tube having a first end and a second end;
a first support located at the first end of the plasma tube;
a seal surrounding the plasma tube at its first end and compressed between the plasma tube and the first support, said seal located at a first distance from the first end of the plasma tube; and
a shield extending a second distance into the plasma tube.

2. The plasma applicator of claim 1 wherein said second distance is greater than the first distance.

3. A plasma applicator comprising:
a cylindrically-shaped outer tube;
a cylindrically-shaped plasma tube located within and concentric with the outer tube, said plasma tube having an inside wall, an input end for receiving a process gas and an opposing output end through which a plasma exits from the plasma tube;
an adapter having a plug extending part way into the plasma tube at the input end and defining an annular gap region between the portion of the plug extending into the plasma tube and the inside wall of the plasma tube, wherein said adapter includes a passage formed therein and in communication with the annular gap region, said gap and said annular region forming a route through which the process gas during operation is flowed into an inner region of the plasma tube that is beyond the plug of the adapter.

4. A plasma applicator comprising:
a cylindrically-shaped outer tube;
a cylindrically-shaped plasma tube located within and axially aligned with the outer tube, said plasma tube having a first end and a second end, said cylindrically shaped plasma tube and outer tube forming an annular gap region therebetween through which a coolant flows during operation;
a first support located at the first end of the plasma tube, said first support having a first hole formed therein and receiving both the plasma tube and the outer tube, said hole having an inside wall;
a first seal surrounding the plasma tube at its first end and extending between the plasma tube and the inside wall of the first hole; and
a second seal surrounding the outer tube and extending between the outer tube and the inside wall of the first hole.

5. The plasma applicator of claim 4 further comprising:
a second support located at the second end of the plasma tube, said second support having a second hole formed therein and receiving both the plasma tube and the outer tube, said second hole having an inside wall;
a third seal surrounding the plasma tube at its second end and extending between the plasma tube and the inside wall of the second hole; and
a fourth seal surrounding the outer tube and extending between the outer tube and the inside wall of the second hole.

6. The plasma applicator of claim 4 wherein said plasma tube has a first length and said outer tube has a second length and wherein said first length is greater than said second length.

7. The plasma applicator of claim 6 wherein said plasma tube extends outside both ends of said outer tube.

8. The plasma applicator of claim 4 wherein said first support includes a plurality of coolant inlet ports passing therethrough and extending into the hole formed therein, said plurality of coolant inlet ports being positioned around the axis of the plasma tube so as to produce a net force on the plasma tube in the radial direction of substantially zero when coolant is injected through said plurality of coolant inlet ports into the annular gap region.

9. A plasma applicator comprising:
a cylindrically-shaped outer tube;
a cylindrically-shaped plasma tube located within and axially aligned with the outer tube, said plasma tube having a first end and a second end, said cylindrically-shaped plasma tube and outer tube forming an annular gap region therebetween through which a coolant flows during operation;
a first support located at the first end of the plasma tube, said first support having a cylindrically-shaped hole formed therein and receiving the plasma tube and the outer tube, said cylindrically-shaped hole having an inside wall;
a first seal surrounding the plasma tube at its first end and extending between the plasma tube and the inside wall of the cylindrically shaped hole; and a second seal surrounding the outer tube and extending between the outer tube and the inside wall of the cylindrically shaped hole;

wherein said first support includes a plurality of coolant inlet ports passing therethrough and extending into the hole formed therein, said plurality of coolant inlet ports being positioned symmetrically around the axis of the plasma tube.

10. The plasma applicator of claim 5 further comprising a central body forming a microwave cavity surrounding the outer tube and located between the first and second supports, said microwave cavity for coupling microwave energy into the plasma tube during operation.

11. The plasma applicator of claim 10 wherein said central body also forms a first resonant cavity circumscribing the outer tube and extending from the microwave cavity in the direction of the first support.

12. The plasma applicator of claim 11 wherein said central body also forms a second resonant cavity circumscribing the outer tube and extending from the microwave cavity in the direction of the second support.

13. The plasma applicator of claim 10 wherein the first and second supports are attached to the central body.

14. The plasma applicator of claim 13 wherein the first and second supports and the central body are all made of metal.

15. The plasma applicator of claim 10 further comprising a tubular-shaped shield extending a predetermined distance into the plasma tube at the first end.

16. The plasma applicator of claim 15 wherein the first mentioned seal is located a first distance from the first end of the plasma tube and wherein the predetermined distance is greater than the first distance.

17. The plasma applicator of claim 2 wherein said shield comprises a tubular shaped extension with a bore through which a plasma exits from the plasma applicator during operation.

18. The plasma applicator of claim 2 wherein said seal comprises an O-ring.

19. The plasma applicator of claim 2 wherein said first support located at the first end of the plasma tube has a first hole formed therein which receives both the plasma tube and the outer tube, said hole having an inside wall, wherein said first-mentioned seal surrounds the plasma tube at its first end and extends between the plasma tube and the inside wall of the first hole, and wherein said applicator further comprises a second seal surrounding the outer tube and extending between the outer tube and the inside wall of the first hole.

20. The plasma applicator of claim 19 further comprising:

a second support located at the second end of the plasma tube, said second support having a second hole formed therein and receiving both the plasma tube and the outer tube, said second hole having an inside wall, and wherein said plasma applicator further comprises a third seal surrounding the plasma tube at its second end and extending between the plasma tube and the inside wall of the second hole; and a fourth seal surrounding the outer tube and extending between the outer tube and the inside wall of the second hole.

21. The plasma applicator of claim 2 wherein said first support is made of metal.

22. The plasma applicator of claim 21 wherein said first support is made of aluminum.

23. The plasma applicator of claim 5 wherein the first, second, third and fourth seals are O-rings.

24. The plasma applicator of claim 8 wherein said plurality of coolant inlet ports is located between the first and second seals.

25. The plasma applicator of claim 24 wherein said first support includes a plurality of coolant inlet ports passing therethrough and extending into the hole formed therein, said plurality of coolant inlet ports being positioned symmetrically around the axis of the plasma tube.

26. The plasma applicator of claim 9 wherein said plurality of coolant inlet ports is located between the first and second seals.

27. The plasma applicator of claim 3 further comprising a central body forming a microwave cavity surrounding the outer tube and located downstream from the plug, said microwave cavity for coupling microwave energy into the plasma tube during operation.

28. The plasma applicator of claim 3 wherein the annular gap region has a width in a radial direction that is sufficiently small so as to inhibit a plasma formed within the plasma tube from extending into the gap region during operation.

29. The plasma applicator of claim 3 wherein said plug includes a hard coat anodization layer.

30. The plasma applicator of claim 3 wherein the adapter is located at a first end of the plasma tube and wherein the plasma applicator further comprises:

a support structure located at the first end of the plasma tube and having a first hole formed therein which receives both the plasma tube and the outer tube, said hole having an inside wall; and a first seal surrounding the plasma tube and extending between the plasma tube and the inside wall of the first hole.

31. The plasma applicator of claim 30 wherein the first seal is located at a first distance from the first end of the plasma tube and said plug extends into the plasma tube a second distance, wherein the second distance is greater than the first distance.

* * * * *